US 6,735,747 B2

(12) United States Patent
Watkins (10) Patent No.: US 6,735,747 B2
(45) Date of Patent: May 11, 2004

(54) PRE-SILICON VERIFICATION PATH COVERAGE (75) Inventor: Daniel R. Watkins, Saratoga, CA (US)

(73) Assignee: LSI Logic Corporation, Milpitas, CA (US)

(*) Notice: Subject to any disclaimer, the term of this patent is extended or adjusted under 35 U.S.C. 154(b) by 9 days.

(21) Appl. No.: 10/166,797

(22) Filed: Jun. 10, 2002

(65) Prior Publication Data

US 2003/0229864 A1 Dec. 11, 2003

(51) Int. Cl.$^7$ ................................ G06F 17/50
(52) U.S. Cl. .............. 716/4; 716/1; 716/5; 716/6; 703/14
(58) Field of Search .............. 716/4, 1, 5, 6; 703/14, 22; 702/117; 714/739

(56) References Cited

U.S. PATENT DOCUMENTS 6,131,080 A * 10/2000 Raimi et al. ................ 703/14
6,170,078 B1 * 1/2001 Erle et al. ..................... 716/4
6,223,144 B1 * 4/2001 Barnett et al. ................ 703/22
6,301,688 B1 * 10/2001 Roy ............................... 716/4
6,347,388 B1 * 2/2002 Hollander ................... 714/739
6,539,523 B1 * 3/2003 Narain et al. .................. 716/5
6,564,356 B1 * 5/2003 Malik et al. ................... 716/4
6,581,191 B1 * 6/2003 Schubert et al. ............... 716/4
6,594,610 B1 * 7/2003 Toutounchi et al. ........ 702/117

* cited by examiner

Primary Examiner—Vuthe Siek
Assistant Examiner—Magid Dimyan
(74) Attorney, Agent, or Firm—Christopher P. Maiorana, P.C.

(57) ABSTRACT

A method for verifying a path coverage of a circuit design. The method generally comprises the steps of implementing a hardware description language to include a plurality of monitors for a plurality of nodes of the circuit design, monitoring the nodes of a programmable circuit implementing the circuit design in real-time to capture node data, and assessing the node data to determine the path coverage.

25 Claims, 7 Drawing Sheets

PRE-SILICON VERIFICATION PATH COVERAGE

FIELD OF THE INVENTION

The present invention relates to methods of verifying path coverage in a circuit design generally and, more particularly, to a pre-silicon verification path coverage.

BACKGROUND OF THE INVENTION

Conventional software tools assess path coverage in software when running simulation test benches or doing traces to memory on instrumented code in hardware. Typically, the code is instrumented and the test benches and test cases are developed interactively to achieve the target path coverage level. Flow graphs are provided to reveal what paths have not yet been covered and the resulting information is tied to the code listing. The code commonly runs 4× slower and the tools add 2× to test time. An un-instrumented version of the code is rerun for the regression at full speed to verify no functional differences between the two code sets. In some cases, checking if the path coverage is relevant is also performed. Furthermore, captures of application code running are often performed. However, a lack of verification progress metrics can lead to misuse of available simulation and silicon-based verification resources. In addition, simulation can be thousands to millions of cycles slower and therefore comprehensive simulation is impractical.

SUMMARY OF THE INVENTION

The present invention concerns a method for verifying a path coverage of a circuit design. The method generally comprises the steps of implementing a hardware description language to include a plurality of monitors for a plurality of nodes of the circuit design, monitoring the nodes of a programmable circuit implementing the circuit design in real-time to capture node data, and assessing the node data to determine the path coverage.

The objects, features and advantages of the present invention include providing a method and architecture that may provide (i) reliable hardware path coverage assessment, (ii) tools that may enable instrumented hardware description language models to have node states save to a trace memory, (iii) a scalable mode capture compression process and/or (iv) tools that may enable hardware trace captures to be presented to simulations tools for path coverage assessment.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
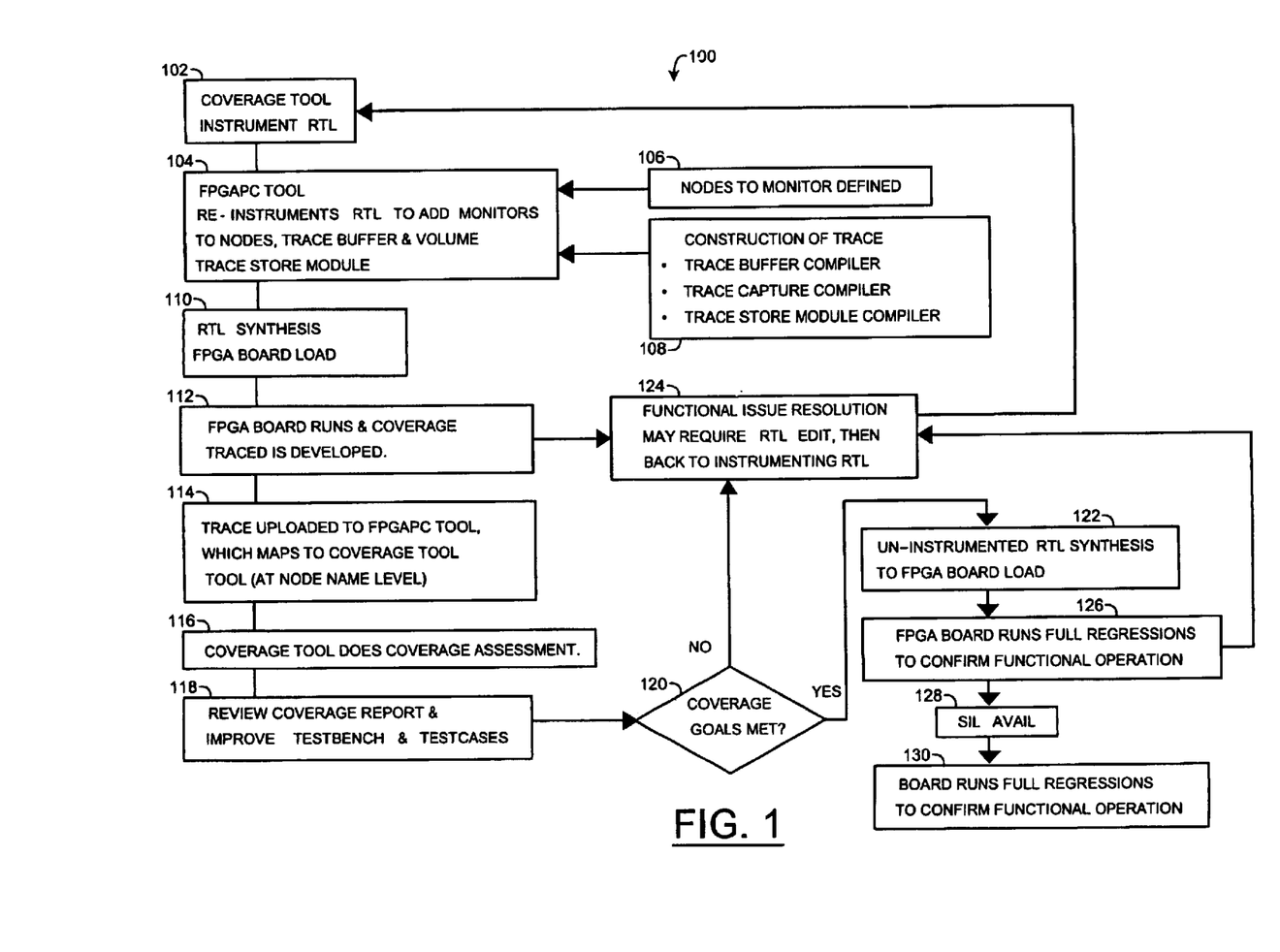
FIG. 1 is a flow diagram of a process for determining a hardware path coverage.

Referring to FIG. 1, a flow diagram of a process 100 for determining a hardware path coverage is shown in accordance with a preferred embodiment of the present invention. The process 100 may provide for a field programmable gate array (FPGA) programming flow that generally allows for a hardware path coverage assessment. The hardware path coverage assessment may be conducted prior to having initial or prototype silicon circuits available for testing. As such, the time used to test the actual silicon circuits when available may be reduced while a confidence in the testing may be increased.

The process 100 generally begins by using a tool to instrument a hardware description language (HDL) representation of the proposed actual silicon circuit (e.g., block 102). The tool used to instrument may be a hardware path coverage tool. The step of instrumenting may include synthesizing test benches and pattern feeds with the test cases that may be manifested in hardware. A resulting simulation environment may be desirable as the simulation environment may then be the same as the proposed actual hardware.

An example of a path coverage tool may be the Verification Navigator suite of tools available from TransEDA Technology, Limited, Los Gatos, Calif. The path coverage tool may provide a simulation environment that generally provides for a verification methodology for managing an HDL verification process. The path coverage tool may include an HDL checking capability, a code analysis, a finite state machine (FSM) coverage analysis and an application-specific automation capability. Support may be provided for Register Transfer Language (RTL), Verilog, Very High Speed Integrated Circuit Hardware Description Language (VHDL), mixed language designs and other languages.

The path coverage tool may be a software only tool that may provide a limited path coverage assessment on VHDL code in a VHDL simulation. The path coverage code is generally instrumented such that no functionality of the proposed actual circuit changes. However, simulations of the instrumented HDL or RTL representation or model may run moderately slower. Accompanying test bench and test cases are generally not changed in transitioning from the instrumented RTL model to the actual circuit. The path coverage may be assessed on code line, if-then-else (consecutively as well) and finite state machines.

Once the instrumented RTL model has been generated, another tool may be used to re-instrument the RTL model to add monitors for RTL nodes (e.g., block 104). The other tool may be referred to as an FPGA personal computer (FPGAPC) tool. The FPGAPC tool may re-instrument the RTL model to add monitors for selected RTL nodes such that real-time traces on each clock cycle may be performed. Re-instrumenting may include conducting a simulation on the re-instrumented RTL code to confirm that no change in functionality has occurred from the instrumented RTL code.

The RTL nodes may be implemented in a fast hardware substitute for the actual silicon circuit. For example, one or more FPGAs may be used with the tools to verify hardware path coverage in real-time or near real-time operations. Other programmable hardware circuits may be used to meet the criteria of a particular test environment.

Additional information or data may be provided to the FPGAPC tool to help define proper re-instrumentation of the RTL model. The additional information may include definitions of the RTL nodes to be monitored (e.g., block 106). Further information may be provided for trace construction (e.g., block 108). The trace construction information may include, but may not be limited to trace buffer compiler data, trace capture compiler data and/or trace store module compiler data.

The re-instrumented RTL code may be synthesized and mapped to an FPGA board (e.g., block 110). The FPGA board may include one or more FPGAs and any support circuitry such as clocks, input/output buffers and the like. The FPGA board generally has the RTL nodes traced at a gate level in real-time with the test benches running the test cases.

The FPGA board may then be operated or run (e.g., block 112). A coverage trace may be developed during operation and stored in a memory. A conventional silicon verification (e.g., sil ver) environment may be run as well using the trace capture.

The trace may be wide in terms of a number of nodes monitored and deep in terms of a depth of the memory storing the captured information. Multiple nodes may be monitored and captured simultaneously. Generally, embedded memory addresses, data output lines, functional inputs and/or functional outputs of the FPGA may be monitored. Nodes internal to the FPGA are generally not monitored.

A hard-disk drive, tape drive, and/or other high bandwidth, high capacity memory recording devices may be used to store the trace information. A hard-disk drive having an advanced technology attachment (ATA) interface may be well suited for recording the trace data since the ATA interface may provide for a 16-bit width and a 132.8 million bit per sec bandwidth. Other mass storage types of devices may also be used.

Prior to storing the trace data, one or more compression techniques may be employed to reduce the information recorded. For example, a compression technique of storing only changes or deltas from previously stored data with information identifying which bits have changed may significantly reduce the size of the stored trace data. Other compression techniques may be used to meet the criteria of a particular test environment. The trace code capture, compression and buffer for an SDRAM type memory or the hard-disk may be a configurable software core of the FPGAPC tool.

In some situations, the trace memory and/or mass storage device may not have a sufficient bandwidth to accommodate the trace data. A solution may be to use otherwise unused input/output capabilities of the FPGA and/or FPGA board to route the trace data to off-chip/off-board memory for temporary storage. For example, a burst of trace data may be buffered and time tagged in a high speed solid state memory coupled directly to an FPGA and then moved to a mass memory device at a later time.

In the event that trace code compression and hard-disk and/or solid state memory storage of trace data may not be adequate, a constrained set of nodes may be monitored for path coverage. One or more constrained sets may be determined by a user at one or more levels. For example, the constraint may be defined at a module level, a sub-module level, or at distributed nodes throughout the multiple nodes. By way of example, only a standard audio transport file formatting function in an audio/visual decoder may be monitored and assessed for path coverage.

During and/or after testing, the trace data may be uploaded and mapped to the coverage tool for assessment of the resulting hardware path coverage (e.g., block 114). Mapping may be provided at a node name level. Other mappings may be provided to meet a criteria for a particular coverage test.

The coverage tool may provide coverage assessment of the captured node data (e.g., block 116). The coverage tool may provide for a display of the assessment results. The display may be a graphical visualization and/or a textual report.

Given that a subset of nodes may be monitored at a given time, the coverage tool may be configured to support multiple colors. For example, the coverage tool may provide support for three colors on graphs and in-line codes. A first color may be provided for indicating information for covered nodes. A second color may be provided for indicating not-covered nodes. A third color may be provided for not-monitored nodes. In one embodiment, the not-monitored nodes may be excluded from the graph and in-line code.

The user generally provides a review of the reports and displays generated by the coverage tool (e.g., block 118). From the review, improvements in the test benches and/or test cases may be determined. If the goals of the hardware path coverage are meet (e.g., the YES branch of decision block 120), the process 100 may continue with a synthesis and loading of an un-instrumented version of the RTL model to the FPGA board (e.g., block 122). If the goals of the hardware path coverage are not meet (e.g., the NO branch of decision block 120), a functional issue resolution may be performed (e.g., block 124).

The test benches and test cases are generally developed (in some cases from the beginning) based on review of the path coverage report. Some initial verification of the use of the test benches and test cases may be done during the simulations (e.g., from block 112), but ultimately, verification may migrate to the FPGA either directly through synthesis or through external methods. Functional resolution may involve editing the RTL model and then instrumenting the RTL model (e.g., block 102). One or more iterations from instrumenting (e.g., block 102), through review of the path coverage achieved (e.g., block 118) and then modifying the RTL model (e.g., block 124) may be performed until a desired path coverage level has been achieved.

Once the desired path coverage level has been achieved, an un-instrumented version of the code may be mapped to the FPGA (e.g., block 122). A full regression may then be run to verify no functional differences between the instrumented and the un-instrumented code sets (e.g., block 126). Once the actual silicon has become available (e.g., block 128), the full regression testing may be performed on the actual silicon circuit (e.g., block 130).

The process 100 may achieve a point of high realized value as the RTL model may be essentially and comprehensively verified without the actual silicon device to test. The process 100 generally leverages the coverage tool and fast hardware, such as the FPGA, to develop the test benches and the test cases. The tools generally use methods to instrument and monitor the RTL nodes in the FPGA hardware. The FPGAPC tool may provide feedback files to the coverage tool such that assessments of coverage may be performed. After any issues are resolved, the test environment may be ready for testing of the actual circuits. Once available, the silicon may be quickly and comprehensively verified.

The coverage path tool is generally event driven and thus may not provide timing information and may not monitor every variable. If an event occurs, a change in the trace data may be noted and the signals are assigned. In other words, the signals are generally not part of a static data structure. The changes may be assessed back down a path to review what path and nodes caused each particular change.

The instrumented code may generally be 1× bigger and the simulation generally runs 2–3× slower than with the un-instrumented code. Functional calls may be embedded in the code. The low level modules may be covered in terms of all of the nodes as a goal. The subsystem level may have a subset of nodes to assess for path coverage. Simulations above the low level modules may become lengthy and without certain precision on coverage. To have an at-speed running for the path coverage may generally increase a pace for achieving coverage significantly. At a system level, nodes may be selected from the register fields of the actual circuit to be tested. Put another way, the RTL nodes from select register bits may be monitored for changes and the paths effectuated by the changes can be monitored for coverage. Essentially, the option exists to monitor device driver (e.g., system level) use of the silicon.

Figure 2:
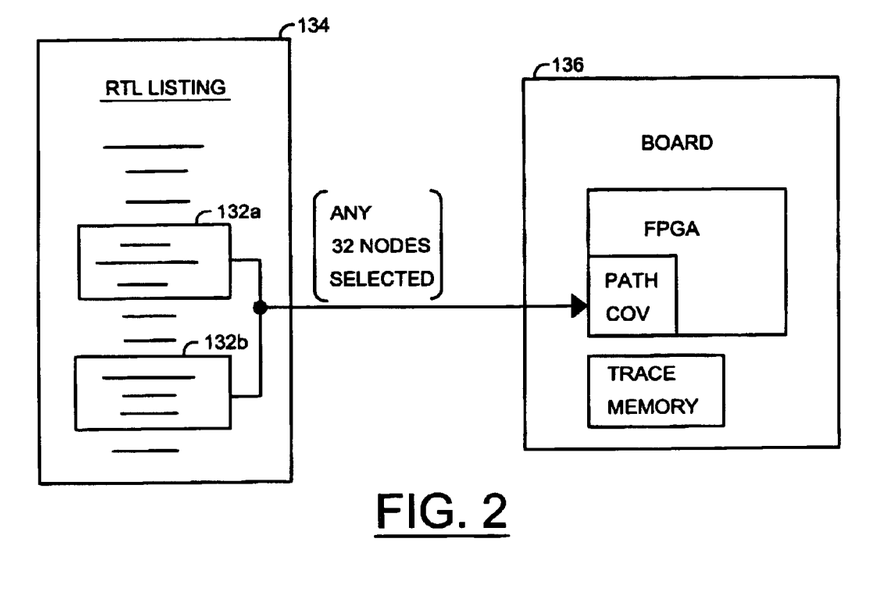
FIG. 2 is a diagram of a hardware path coverage arrangement.

Referring to FIG. 2, a diagram of a hardware path coverage arrangement is shown. In practical applications, a subset 132 of the nodes from an RTL listing 134 is generally monitored. Subset monitoring may be achieved by instrumenting a subset of the nodes or instrumenting the entire node set and enabling a subset of the nodes to be monitored. If code or path coverage results are available, the results may guide which paths are not covered and therefore which paths should be monitored with focused test cases. The gathering of nodes into groups of several dozen (e.g., thirty-two nodes/group) may be performed as well as specifying the priority of the groups. From the node groups so arranged, the user may select particular bitstreams and/or other patterns to apply to achieve the desired coverage.

Figure 3:
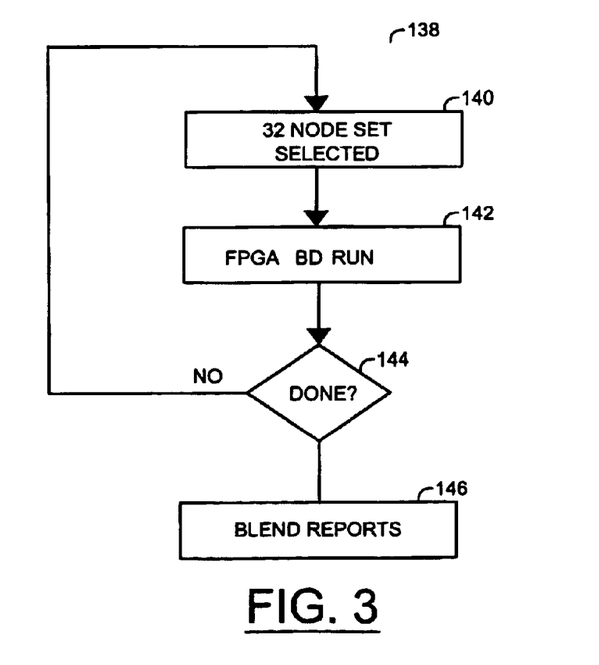
FIG. 3 is a flow diagram of a process for testing a field programmable gate array.

Referring to FIG. 3, a flow diagram of a process 138 of testing an FPGA is shown. The coverage tool may feed the node traces thirty-two at a time to the FPGA board 136 (e.g., block 140). The remaining nodes may be effectively zeroed out. The FPGA board 136 may then be operated or run (e.g., block 142). If all of the nodes have not completed testing (e.g., the NO branch of decision block 144), another thirty-two node set may be selected (e.g., block 140). Once all of the node sets have been tested (e.g., the YES branch of decision block 144), each of the path coverage reports may be blended into an overall report (e.g., block 146).

Figure 4:
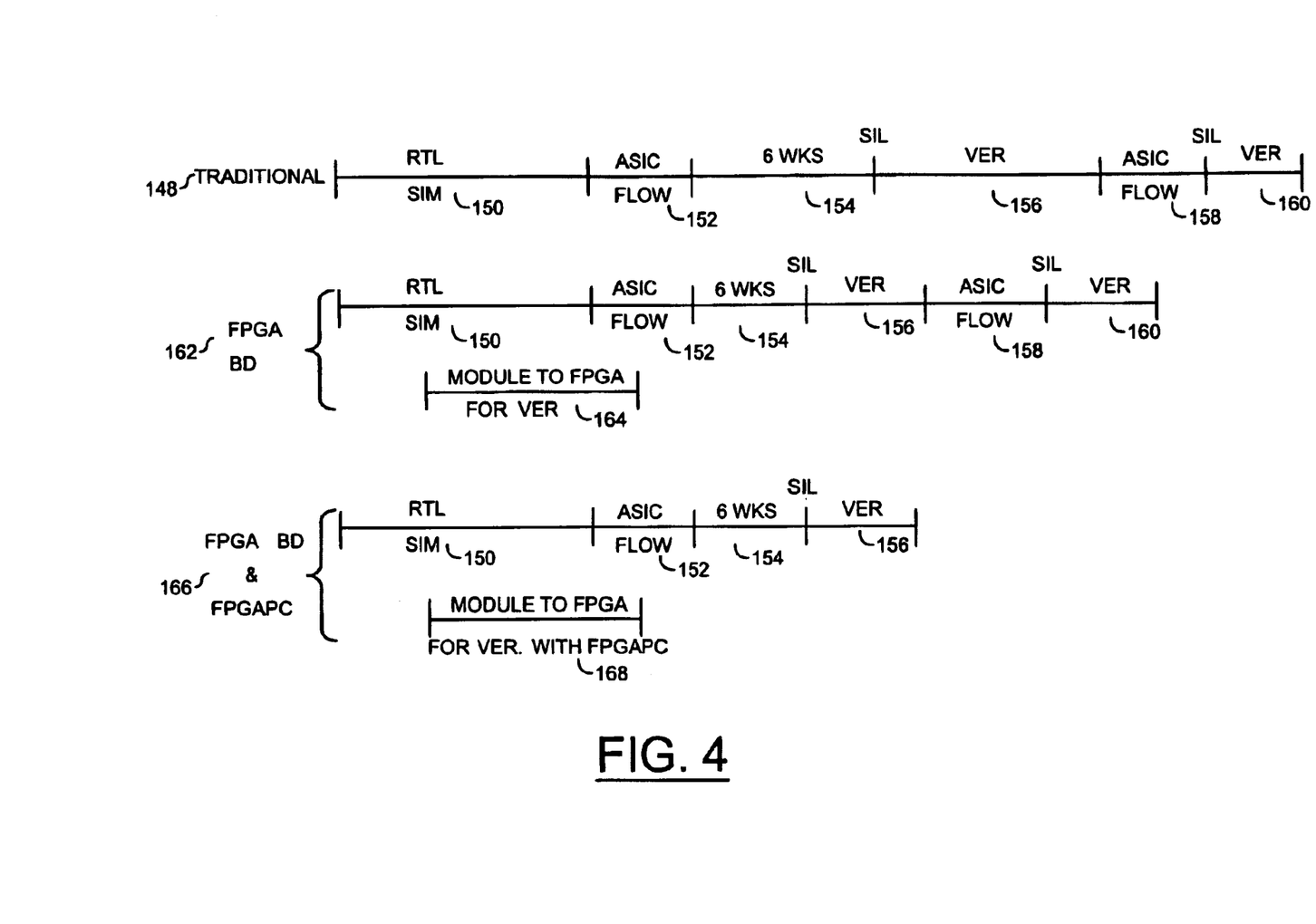
FIG. 4 is a time line comparing several verification development approaches.

Referring to FIG. 4, a time line of several verification development approaches is shown. A conventional time line 148 may provide for an RTL simulation development period 150. The model may then flow to the actual silicon that is generally an application specific integrated circuit (ASIC) during a period 152. The ASIC may then be tested (e.g., period 154) and path coverage verified (e.g., period 156). Any changes to the test benches and test cases may be made, and the conventional process 148 may repeat flowing to the ASIC (e.g., block 158) and verification (e.g., block 160) one or more times until the desired path coverage is achieved.

A development approach 162 using the FPGA board may reduce an overall time to achieve the desired path coverage as compared with the conventional approach 148. The periods 150 and 152 may still be used to develop and flow the RTL model to the ASIC. However, a concurrent period 164 may be used to map the RTL modules to an FPGA for early path coverage verification. As a result, the subsequent testing and verification periods 154–160 may be shorter in time.

A development approach 166 using the FPGA board and the FPGAPC tool may reduce an overall time to achieve the desired path coverage as compared with the approach 162. The development approach 166 may include the periods 150 and 152 to develop and flow the RTL model to the ASIC. In addition, the approach 166 may include a concurrent period 168 where the RTL model may be re-instrumented by the FPGAPC tool to improve path coverage assessment. Since the desired path coverage may be achieved prior to availability of the ASIC, the approach 166 of the present invention may eliminate the periods 158 and 160 to iterate the flow and verification steps.

Figure 5:
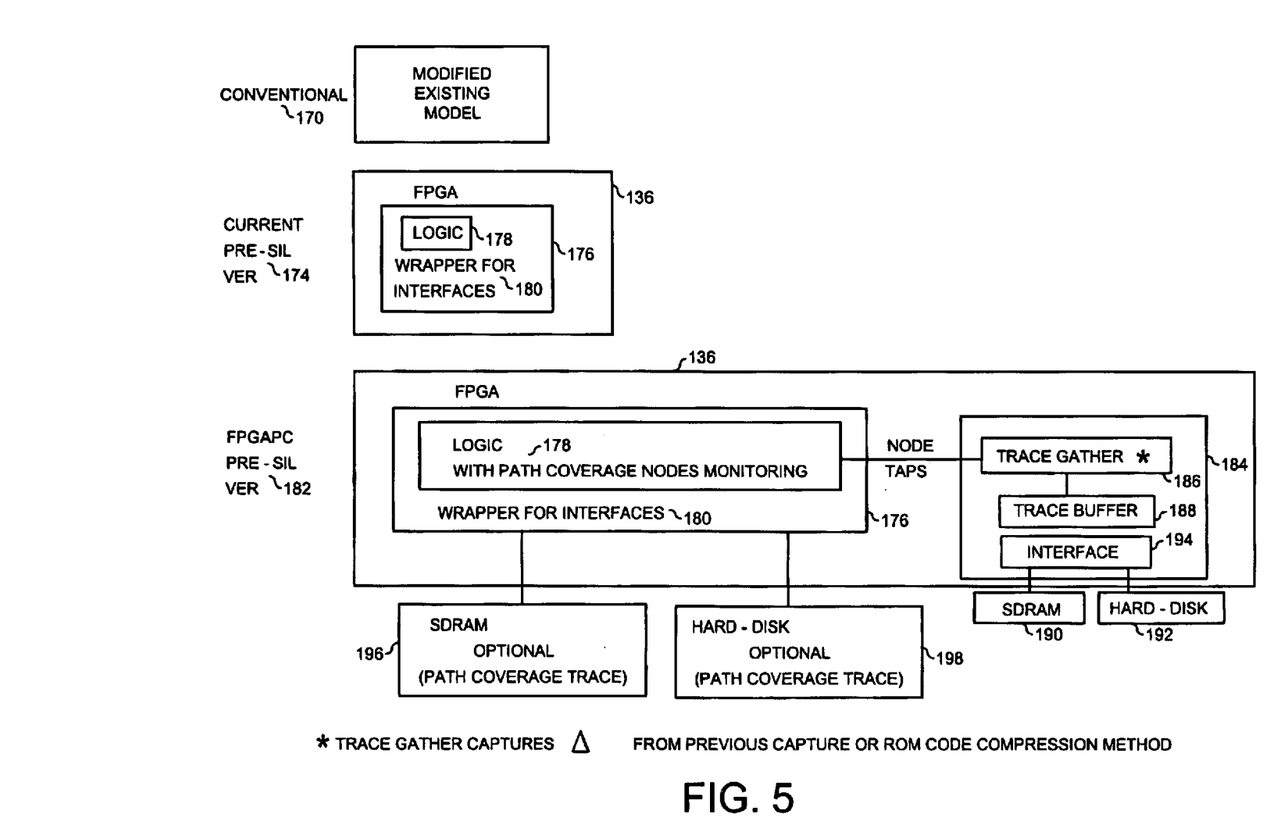
FIG. 5 is a block diagram comparing several verification implementations.

Referring to FIG. 5, a block diagram comparing several verification implementations is shown. A conventional model implementation 170 may provide for modifying an existing to approximate the planned silicon circuit. The conventional implementation 170 may be useful in the conventional development approach 148.

The present invention may provide an implementation 174 that includes the FPGA board 136 and the FPGA 176. The FPGA 176 generally comprises logic 178 configured or programmed to represent the ASIC. The FPGA 176 may further comprise a wrapper 180 for interfacing the logic 178 to the rest of the FPGA board 136 and beyond.

An implementation 182 incorporating the FPGAPC tool may include the FPGA board 136 and the FPGA 176. In addition, the FPGA board 136 may include circuitry 184 for gathering trace data from taps and interfaces of the FPGA 176. The circuitry 184 generally comprises a trace gather circuit or logic 186 for receiving the node data or trace data. A trace buffer circuit 188 may provide a mechanism for temporarily buffering the trace data gathered by the trace gathering circuit 186 prior to storing in a high-speed memory 190 or mass storage device 192. An interface circuit 194 of the circuitry 184 may provide communications and data transfer to and from the memory 190 and the mass storage device 192.

One or more optional memories 196 may be coupled directly to the FPGA 176. The memory 196 may provide storage for node or trace data when that the trace gathering circuit 186 may be unable to handle the data rate. One or more optional mass storage devices 198 may also be connected directly to the FPGA 176. The mass storage device 198 may be implemented as a large hard-disk drive or tape drive capable of storing large amounts of trace data at relatively modest rates. In one embodiment, the memory 196 may provide a cache or buffer function for the mass storage device 198 to smooth data transfer rates to the mass storage device 198.

Figure 6:
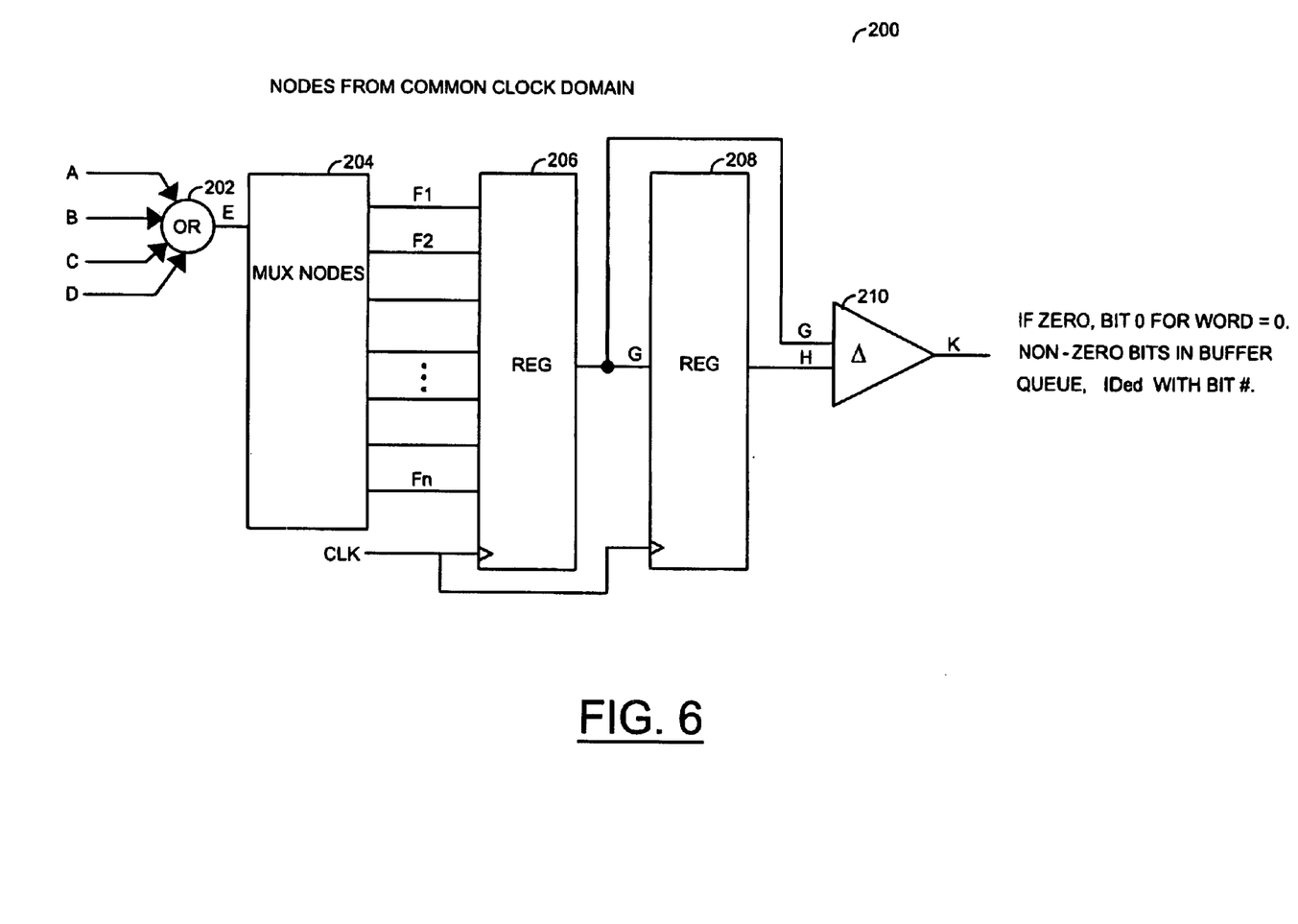
FIG. 6 is a block diagram of an example compression circuit.

Referring to FIG. 6, a block diagram of an example compression circuit 200 is shown. The compression circuit 200 may be integral to the FPGA 176, part of the FPGA board 136, or divided between the two. The compression circuit 200 generally comprises one or more logical OR functions 202, a multiplexer 204, a register 206, another register 208, and a comparator 210.

The logical OR functions 202 may receive multiple node data or trace data signals (e.g., A, B, C and D). The data signals A–D generally come from nodes in a common clock domain having a clock signal (e.g., CLK). The logical OR function 202 may combine the trace data signals A–D into a signal (e.g., E) that may be provided to the multiplexer 204. Other logical OR functions 202 (not shown) may also provide other combined signals to the multiplexer 204. In one embodiment, some or all of the trace data signals A–D may bypass the logical OR functions 202 and may be received directly by the multiplexer 204 as individual signals.

The multiplexer 204 may multiplex the signals received from the logical OR functions 202 to generate a multi-bit signal (e.g., F having individual bits F1–Fn). The signal F may be stored by the register 206. Timing of the storage in the register 206 may be determined by the clock signal CLK.

During each cycle of the clock signal CLK, the register 206 may present the stored trace data as a signal (e.g., G) to the second register 208. Timing of the storage in the register 208 may be determined by the clock signal CLK. Meanwhile, the register 206 may receive and store a new set of trace data through the signal F.

The register 208 may present the stored trace data as a signal (e.g., H).

The signal G may represent a current snapshot of the trace or node data as stored in the register 206 at a time Tn. The signal H may represent a previous snapshot of the trace or node data as stored in the register 208 at a time Tn−1. The comparator 210 may compare the signals G and H bit-by-bit to generate a signal (e.g., K).

The signal K may represent compressed trace data. For example, the signal K may convey a delta in the trace data from the time Tn−1 to the time Tn. In one embodiment, the comparator may generate the signal K with a logical zero value to indicate no change from the signal H and the signal G. The signal K may be generated with a logical one value to indicate that there may be one or more differences in the bits of the signal G and the bits of the signal H. Other forms of compression may be implemented to meet the criteria of a particular test environment.

One or more formats for a compressed node trace may be implemented for any given test scenario. Generally, multiple compression formats may be used to provide high compression ratios. The format compression may include, but are not limited to the following examples.

Format 1 may provide for one bit to indicate a delta in the trace data. The bit may be set to a logical zero to represent zero or no delta between two consecutively captured words. The bit may be set to a logical one to indicate a presence of a change between the consecutive words. Other bits may be appended to the logical one to help identify the changes.

Format 2 generally provides for up to 128 zero delta words represented in compression for only a 10 bit format. Format 2 may be expressed as 1-00-xxxxxxx. The first bit ("1") may represent a non-zero delta. The next two bits ("00") may identify the compressed data as format 2 type. The final seven bits may represent the number of delta words.

Format 3 generally provides up to four delta words and up to two adjustment bits for adding or subtracting for seven possible values per delta word. Format 3 may be expressed as 1-01-xx-yy-s. The first bit ("01") may represent non-zero delta. The next two bits ("01") may identify the compressed data as being format 3. The next two bits ("xx") generally represent a particular delta word to be used. The next two bits ("yy") may represent the number of adjustment bits to add or subtract to the delta word. The last bit ("s") may be a sign bit signifying to add or subtract.

Format 4 may have up to sixteen delta words and up to six adjustment bits for adding or subtracting for 127 values per delta word. Format 4 is generally expressed as 1-10-xxxx-yyyyyy-s. The first bit ("1") generally represents non-zero delta. The next two bits ("10") may represent format 4. The next four bits ("xxxx") may represent a particular delta word to be used. The next six bits ("yyyyyy") generally represent a number of adjustment bits to add or subtract to the particular delta word. The last bit ("s") may be a sign bit signifying to add or subtract from the particular delta word.

Format 5 may have up to sixteen delta words and up to ten adjustment bits for adding or subtracting for 2047 values per delta word. Format 5 may be 1-110-xxxx-yyyyyyyyyy-s. The first bit ("1") generally represents a non-zero delta. The next three bits ("110") may identify format 5. The next four bits ("xxxx") generally represent a particular delta word to be used. The next ten bits ("yyyyyyyyyy") may represent a number of adjustment bits to add or subtract to the particular delta word. The last bit ("s") may be a sign bit signifying to add or subtract.

Format 6 may be a 32-bit uncompressed word. Format 6 may be expressed as 1-111-32_bit_word. The first bit ("1") may represent a non-zero delta. The next three bits ("111") may identify the Format 6. The subsequent thirty-two bits may be the uncompressed 32-bit word.

A process of compression generally involves assessing candidate deltas to be stored, storing the delta words and processing subsequent words that are then compressed. Typical compression may be 4-to-1. For example, every second of 32 nodes captured at 27 megahertz (MHz) and compressed at 4-to-1 may result in a 216 million bits per (Mbps) second rate. A main memory (e.g., memory 190) operating at 162 MHz with a 16-bit bus, or 2592 Mbps shared with other processes, may accommodate the compressed data. A mass storage device (e.g., hard-disk drive 192) operating at 16 MBps, or 128 Mbps with a 4-to-1 compression capture at 27 MHz, may accommodate captures of 19 nodes simultaneously in real time. The user may therefore be selective with the nodes selected for path coverage as even a 60 GB hard-disk drive may be fill up running at 128 Mbps in eight hours.

Figure 7:
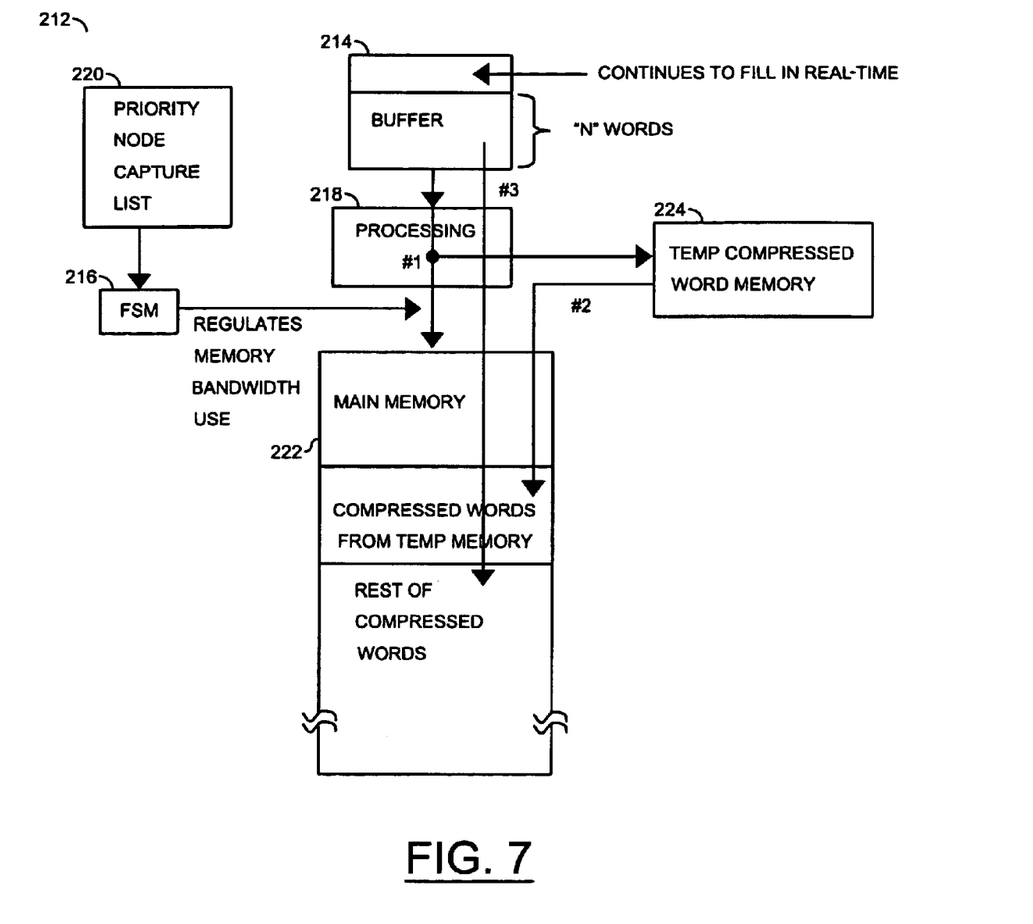
FIG. 7 is a block diagram of an architecture for compression.

Referring to FIG. 7, a block diagram of an architecture 212 for compression is shown. A buffer 214 may be filled with the first 'n' 32-bit word traces. As the buffer 214 fills, a finite state machine (FSM) 216 generally controls processing 218 of the data to best assign delta values across the various formats. The FSM 216 may control processing of the trace data according to a priority node capture list 220. Whatever delta values that have not yet been assigned may be assigned as needed in real-time. Compressed words may be stored in a main memory 222 or a temporary memory 224. Compressed words from the temporary memory 224 may be moved to the main memory 222 as time permits. During the buffer assessment, 32-bit word capture may continue. The value of 'n' may be determined by the user or may be defaulted in the design.

An example of a compression scheme may involve multiple processing steps. After the trace data has been buffered, processing 218 may operate on the 'n' words to find and compress the format 1 delta values having the logical zero value. The compressed words may be stored in the temporary memory 224. A delta value may be stored in the main memory 222. The FSM 216 may regulate storage into the main memory 222 to maintain bandwidth use to acceptable values. The FSM regulation may be based on the priority list 220.

Processing may continue with some or all of the remaining 'n' words that fit format 2. The format 2 compressed words may be based upon the format 1 delta word stored in the main memory 222. The format 2 compressed words may be generated and buffered in the temporary memory 224.

After processing the format 2 words, the remaining 'n' words may be checked for format 3 fits. Up to four possible format 3 delta words may be generated and stored in the main memory 222. The format 3 compressed words may be generated and stored in the temporary memory 224.

Process may continue with the remaining 'n' words from the above step for most or all of the format 4 fits. Sixteen possible format 4 delta words may be generated and stored in the main memory 222. The format 4 compressed words may be buffered in the temporary memory 224.

Process of the remaining 'n' words from the above step may continue for most or all of the format 5 fits. Up to sixteen possible format 5 delta words may be stored in the main memory 222. The format 5 compressed word may be generated and stored in the temporary memory 224.

After processing the format 5 data, processing of the remaining 'n' words may be considered to fit the format 6 un-compressed format. The format 6 data may be moved from the buffer 214 to the main memory 222 after adding the format 6 header information. Upon completion of processing the 'n' words in the buffer 214, the compressed words stored in the temporary memory 224 may be copied to the main memory 222. A new set of 'n' words may be selected from the buffer 214 and the compression process repeated for the real-time captured data.

Figure 8:
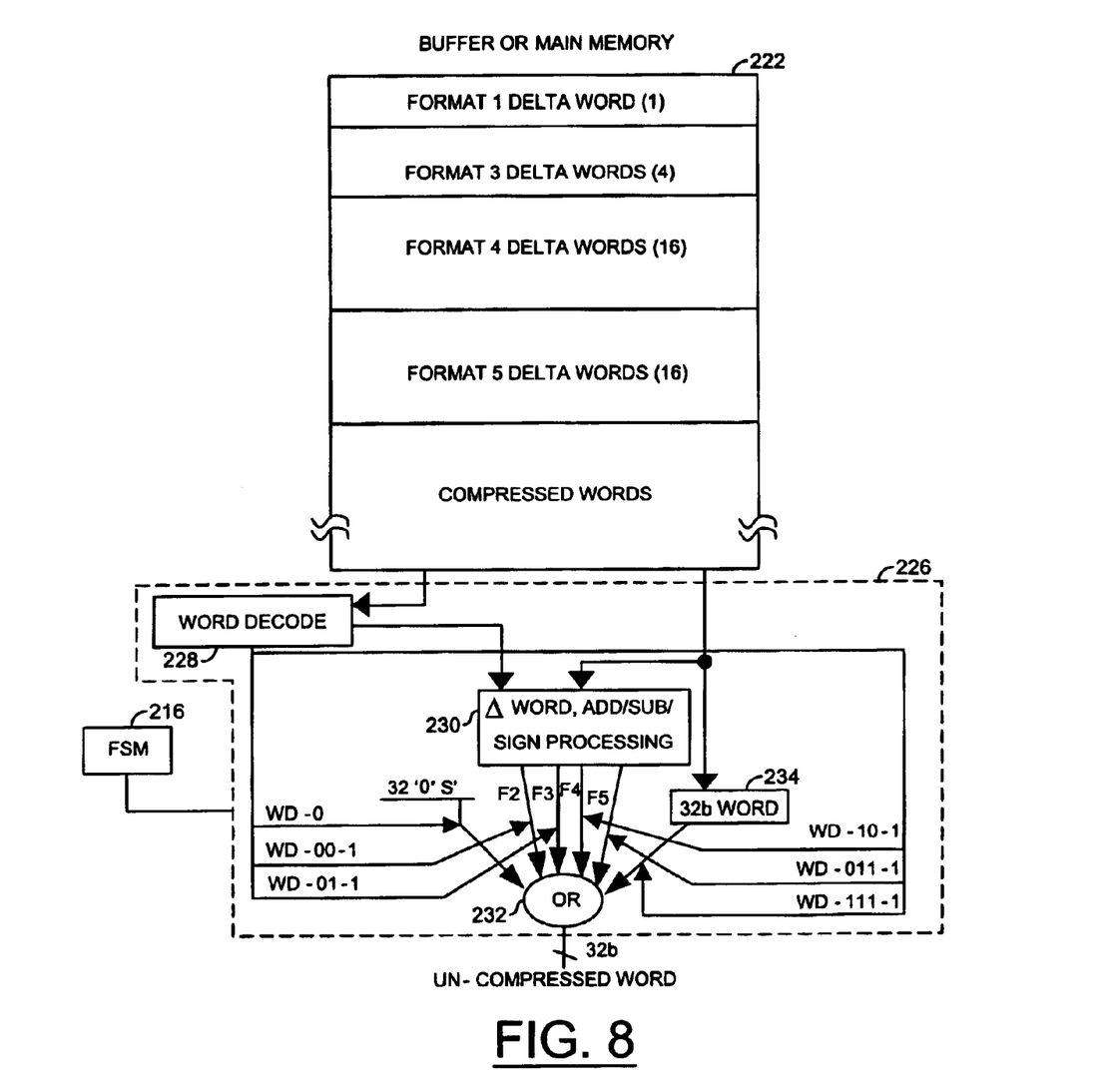
FIG. 8 is a functional block diagram of a decompression circuit.

Referring to FIG. 8, a functional block diagram of a decompression circuit 226 for decompressing the compressed data is shown. The decompression circuit 226 generally comprises a word decoder circuit 228, a processing circuit 230, a logic circuit 232 and a register 234. The decompression circuit 226 may receive un-compressed words and the delta words from the main memory 222 or from another buffer. The decompression circuit 226 may also communicate with the FSM 216 for control during retrieval of the data from the main memory 222.

The compressed words may be provided sequentially from the main memory 222 to the word decoder circuit 228. The word decoder circuit 228 may examine the headers of each of the compressed words to determine which format was used in compression. Where applicable, the word decoder circuit 228 may also parse the reference to a particular delta word for the respective format. Furthermore, the word decoder circuit 228 may also parse the adjustment bits and sign bits from the compressed words for the formats 3, 4 and 5. The word decoder circuit 228 may then inform the processing circuit 230 and the logic circuit 232 of the formats, delta words, adjustment bits and sign bits.

The processing circuit 230 may receive the delta words and uncompressed words from the main memory 222. The processing circuit 120 may also receive the adjustment bits and the sign bits from the word decoder circuit 228. The register 234 may buffer an uncompressed word that may be used to determined a subsequent uncompressed word.

The decompressing process generally involves initially reading and presenting an uncompressed word from the main memory 222. A subsequent compressed word may be read and a next uncompressed word may be generated from the uncompressed word and where appropriate, the compressed word, delta words, adjustment bits and/or sign bits. The process may then be repeated on subsequent compressed words in the main memory 222 until a new uncompressed word may be reached and buffered. Thereafter, decompression continues based upon the newly buffered uncompressed word.

Where the compressed word used the format 1, the word decoder circuit 228 may inform the logic circuit 232 to pass through the buffered uncompressed word in the register 234 unmodified. The logic circuit 232 may pass through the buffered uncompressed word from the register 234 unmodified by logically OR'ing the buffered uncompressed word with a null word filled with all logical zeros.

Where the word decoder circuit 228 identifies the compressed word as having format 2, the word decoder circuit 228 may instruct the logic circuit 232 to repeatedly pass through the buffered uncompressed word from the register 234 a number of times. The repeated pass through number may be extracted from the format 2 compressed word by the word decoder circuit 228. The number of repeats may range from a value of one to a value of 128. Other values for the number of repeats may be implemented by adjusting the format 2 appropriately.

Compressed words identified as having formats 3, 4 or 5 generally result in the processing circuit 230 adding or subtracting from the buffered uncompressed word accordingly. For example, a format 3 compressed word may cause the processing circuit 230 to present a signal (e.g., F3) based upon the uncompressed word in the register 234 and the format 3 delta word in the main memory 222 identified by the word decoder circuit 228. The logic circuit 232 may then logically OR the uncompressed word buffered in the register 234 with the signal F3 to generate the next uncompressed word. Similar processing may be performed for format 4 and 5 compressed words by the processing circuit 230 to generate similar signals (e.g., F4 and F5). The logic circuit 232 may logically OR the signals F4 or F5 with the uncompressed word in the register 234 to create the next uncompressed word.

Achieving measurable, comprehensive, functional verification at hardware speeds is generally enabled with the FPGAPC tool and the flow using the FPGAPC tool. Immediate value of the methodology may be realized in the new sections of market standard parts. The approach also may have broad applicability to ASICs in general and specifically ASICs where new sections may be available in FPGAS. Simulation runtimes generally constrain the path coverage verification that may be achieved, but running test benches and test cases at-speed while capturing relevant node states to assess path coverage may enable significant insight into what value specific test cases have. The approach generally leads to refined sets of test cases that may be useful and may save significantly in development and run time, translating to earlier time to market for the silicon that may be comprehensively verified. As such, significant dollars savings in silicon development may be realized. Furthermore, portions of the invention may be implemented, such as the FPGA flow, to enable the hardware path coverage and upload of results to the simulation path coverage tool to assess coverage results.

The various signals of the present invention are generally "on" (e.g., a digital HIGH, or 1) or "off" (e.g., a digital LOW, or 0). However, the particular polarities of the on (e.g., asserted) and off (e.g., de-asserted) states of the signals may be adjusted (e.g., reversed) accordingly to meet the design criteria of a particular implementation. Additionally, inverters may be added to change a particular polarity of the signals. As used herein, the term "simultaneously" is meant to describe events that share some common time period but the term is not meant to be limited to events that begin at the same point in time, end at the same point in time, or have the same duration.

The function performed by the flow diagram of FIG. 1 may be implemented using a conventional general purpose digital computer programmed according to the teachings of the present specification, as will be apparent to those skilled in the relevant art(s). Appropriate software coding can readily be prepared by skilled programmers based on the teachings of the present disclosure, as will also be apparent to those skilled in the relevant art(s)

The present invention may also be implemented by the preparation of ASICs, FPGAs, or by interconnecting an appropriate network of conventional component circuits, as is described herein, modifications of which will be readily apparent to those skilled in the art(s)

The present invention thus may also include a computer product which may be a storage medium including instructions which can be used to program a computer to perform a process in accordance with the present invention. The storage medium can include, but is not limited to, any type of disk including floppy disk, optical disk, CD-ROM, and magneto-optical disks, ROMS, RAMs, EPROMs, EEPROMs, Flash memory, magnetic or optical cards, or any type of media suitable for storing electronic instructions.

While the invention has been particularly shown and described with reference to the preferred embodiments thereof, it will be understood by those skilled in the art that various changes in form and details may be made without departing from the spirit and scope of the invention.

What is claimed is:

1. A method for verifying a path coverage of a circuit design, comprising the steps of:
    (A) instrumenting a hardware description language of said circuit design;
    (B) adding a plurality of monitors for a plurality of nodes of said circuit design to said hardware description language of said circuit design after said instrumenting;
    (C) monitoring said nodes of a programmable circuit implementing said circuit design in real-time to capture node data;
    (D) mapping said node data from a first tool to a second tool; and
    (E) assessing said node data with said second tool to determine said path coverage among a plurality of paths in said circuit design.

2. The method according to claim 1, further comprising the steps of:
    regression testing an un-instrumented version of said hardware description language to confirm functional operation; and
    testing a hardware circuit implementing said circuit design at normal speed using said un-instrumented version of said hardware description language.

3. The method according to claim 1, further comprising the steps of:
    compressing said node data in response to said monitoring; and
    storing said node data prior to said uploading.

4. The method according to claim 3, wherein said compressing is (i) scalable and (ii) has a plurality of compressed formats.

5. The method according to claim 4, further comprising the step of assessing candidate changes of said node data for saving prior to said storing.

6. The method according to claim 3, further comprising the step of decompressing said node data prior to said assessing.

7. The method according to claim 1, further comprising the step of limiting said monitoring to a predetermined set of said nodes.

8. The method according to claim 7, wherein the step of assessing comprises the sub-step of generating results for covered nodes.

9. The method according to claim 8, wherein the step of assessing further comprises the sub-step of generating information for not-covered nodes and not-monitored nodes.

10. A storage medium for use in a computer, said storage medium recording a computer program comprising the steps of claim 1.

11. An apparatus comprising:
    a first tool configured to (i) instrument a hardware description language of a circuit design and (ii) assess node data to determine a path coverage;
    a second tool configured to (i) add a plurality of monitors for a plurality of nodes of said circuit design and (ii) monitor said nodes of a programmable circuit implementing said circuit design in real-time to capture said node data; and
    a circuit directly connectable to said programmable circuit and configured to temporarily buffer said node data.

12. The apparatus according to claim 11, further comprising a memory configured to store said node data temporarily buffered by said circuit.

13. The apparatus according to claim 12, wherein said circuit comprises a third tool configured to regulate a usage of said memory based upon a priority list.

14. The apparatus according to claim 12, further comprising a second memory directly couplable to said programmable circuit and configured to temporarily store at least a portion of said node data.

15. The apparatus according to claim 11, wherein said second tool is further configured to trace said nodes at a gate level in real-time.

16. The apparatus according to claim 11, wherein said first tool is further configured to feed a plurality of patterns to a subset of said nodes of said programmable circuit.

17. The apparatus according to claim 16, wherein said first tool is further configured to blend a plurality of partial path coverage assessments to determine said path coverage.

18. The apparatus according to claim 11, wherein said second tool is further configured to monitor (i) a predetermined node of said nodes from a register field for a change and (ii) at least one path effectuated by said change.

19. The apparatus according to claim 11, wherein said programmable circuit is a field programmable gate array.

20. The apparatus according to claim 11, wherein said circuit comprises:
    a gather circuit configured to received said node data directly from said programmable circuit;
    a buffer circuit configured to temporarily store said node data received by said gather circuit; and
    an interface circuit configured to transfer said node data from said buffer circuit to external said circuit.

21. A method for verifying a path coverage of a circuit design, comprising the steps of:
    (A) monitoring a plurality of nodes of a programmable circuit implementing said circuit design in real-time to capture node data;
    (B) compressing a first portion of said node data;
    (C) adding a header to a second portion of said node data to indicate an uncompressed format;
    (D) storing said first portion of said node data and said second portion of said node data in a memory; and
    (E) assessing said node data to determine said path coverage among a plurality of paths in said circuit design.

22. The method according to claim 21, wherein said step (B) comprises the sub-step of formatting a plurality of changes in said node data into a plurality of compression formats.

23. The method according to claim 22, further comprising the step of prioritizing said node data prior to storing to maintain bandwidth use of said memory.

24. The method according to claim 22, further comprising the step of assessing said changes for additional processing prior to compressing.

25. An apparatus comprising:

means for implementing a hardware description language to include a plurality of monitors for a plurality of nodes of said circuit design;

means for monitoring said nodes of a programmable circuit implementing said circuit design in real-time to capture node data; and means for assessing said node data to determine said path coverage.

* * * * *